United States Patent [19]

Reimann

[11] Patent Number: 4,591,411
[45] Date of Patent: May 27, 1986

[54] METHOD FOR FORMING A HIGH DENSITY PRINTED WIRING BOARD

[75] Inventor: William G. Reimann, Los Angeles, Calif.

[73] Assignee: Hughes Aircraft Company, Los Angeles, Calif.

[21] Appl. No.: 636,783

[22] Filed: Jul. 31, 1984

Related U.S. Application Data

[63] Continuation of Ser. No. 374,837, May 5, 1982, abandoned.

[51] Int. Cl.$^4$ .................. H01L 21/306; H01L 21/312
[52] U.S. Cl. .................... 156/634; 156/656; 156/661.1; 156/902
[58] Field of Search ............... 427/53.1, 97; 204/15; 156/661.1, 656, 901, 902, 634

[56] References Cited

U.S. PATENT DOCUMENTS

| | | | |
|---|---|---|---|
| 3,335,489 | 8/1967 | Grant | 29/628 |
| 3,391,457 | 8/1968 | Reimann | 29/625 |
| 3,464,855 | 9/1969 | Shaheen et al. | 427/97 |

FOREIGN PATENT DOCUMENTS

| | | |
|---|---|---|
| 859934 | 12/1970 | Canada . |
| 981797 | 1/1976 | Canada . |
| 1378154 | 10/1964 | France . |
| 2117172 | 7/1972 | France . |

OTHER PUBLICATIONS

Greene, K. F., "Producing Printed Circuit Boards", *IBM Technical Disclosure Bulletin*, vol. 11, No. 12, May 1969, p. 1676.
Smith, J. F. et al., "Selectively Removing Dielectric Materials", *IBM Technical Disclosure Bulletin*, vol. 11, No. 9, Feb. 1969, p. 1151.

*Primary Examiner*—Evan K. Lawrence
*Attorney, Agent, or Firm*—Lewis B. Sternfels; Victor G. Laslo; A. W. Karambelas

[57] ABSTRACT

Feed-through vias (38) of 8 mil and smaller diameter are placed on 25 mil centers or smaller so that the feed-through vias serve only as electrical connections and do not block channels between conductors (24a and 42a). The method for forming such feed-through vias and interconnections utilizes a metallic resist (36 and 40) which covers the feed-through vias so that the metallic resist, along with conventional photoresist material, prevent undesired etching of the feed-through vias even in the event of misregistration of the photoresist material.

16 Claims, 5 Drawing Figures

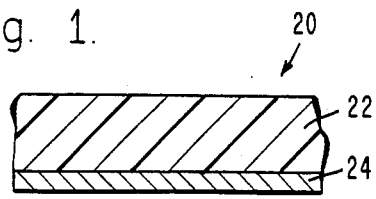
Fig. 1.
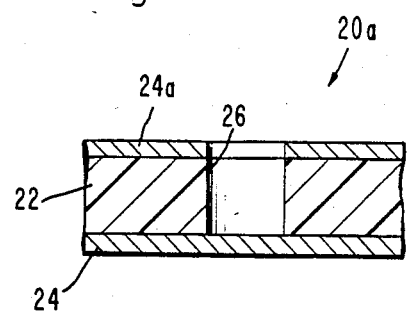
Fig. 2a.
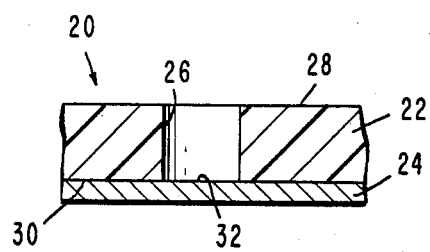
Fig. 2.
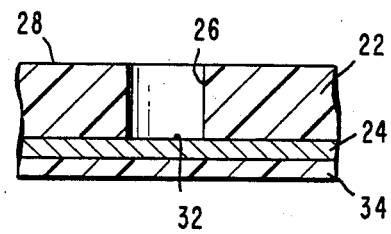
Fig. 3.
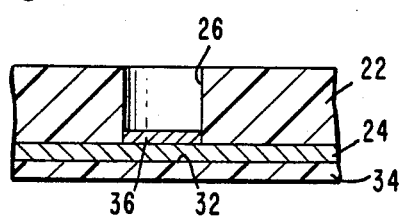
Fig. 4.
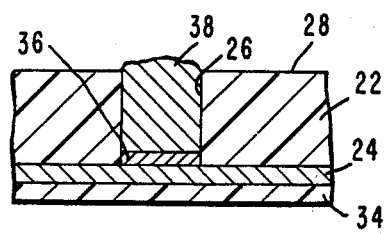
Fig. 5.
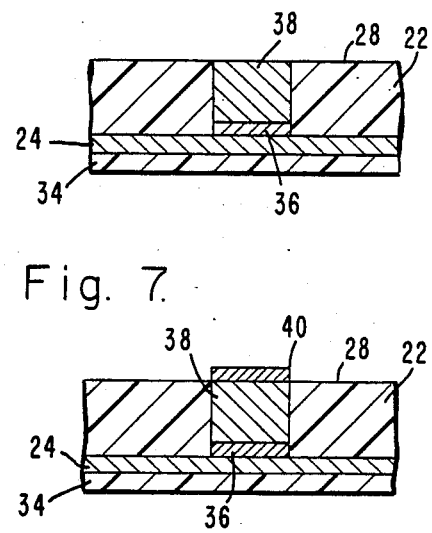
Fig. 6.
Fig. 7.
Fig. 8.

METHOD FOR FORMING A HIGH DENSITY PRINTED WIRING BOARD

This is a continuation of Ser. No. 374,837 filed May 5, 1982, abandoned.

BACKGROUND OF THE INVENTION

1. Field of the Invention

The present invention relates to printed wiring boards and, in particular, to layers therefor having increased, high density conductors and feed-through vias.

2. Description of the Prior Art

The number of conductors, which can be successfully positioned on a conventional layer of a multilayer printed wiring board, is limited primarily by the large pads of copper which provide terminations for the conductors. Each pad, and even more so clusters of pads, effectively block channels or locations for the conductors, making it necessary to move the conductors to other less dense layers in the printed wiring board in order to make a connection. The functions of such pads conventionally are electrical and mechanical. The electrical function is to make an electrical connection at the pad, such as to a feed-through or via in the layer, and for this function, it could be much smaller. The purpose of the mechanical function enables the feed-through hole to be completely surrounded in a worst tolerance condition and to prevent etchants from attacking the metal in and adjacent to the hole during board fabrication. Thus, the pad must be made very large, typically 20 mils or more larger than that needed to satisfy its electrical function.

Specifically, the conventional process of forming an etched feedthrough hole or via begins with a blank comprising a core of dielectric material which is doubly cladded with copper. To form the feed-through, holes are drilled through the blank and made conductive with sequential deposits of electroless and electroplated copper. Photoresist material is then formed in a pattern over all exposed metal on the blank except for the surface conductors, lands and holes. Finally, additional copper, followed by tin-lead solder, is electroplated about and into the plated hole and on the conductive material about the plated hole to form a land area. The photoresist is removed and, using the solder as an etch resistant material, the exposed cladding is etched to form conductors on the surfaces of the blank and to form it into a printed wiring board layer. It is obvious, therefore, that the copper and solder plated pad functions both as a means for electrical connection as well as for protection against etching of the copper in the hole. If these plated through holes were vias in an internal layer of a multilayer printed wiring board, the solder plate would be stripped prior to lamination in order to enhance bonding. As an alternate to plating solder around and into the holes, the holes may be tented with photoresist film before the etching operation.

The size of the land area, which is used to protect the copper deposited in and about the feed-through hole during etching, is determined by three major factors. First, there must be sufficient tolerance, typically of 10 mils, to afford a proper registration from one photoresist pattern to another. For example, the holes must be surrounded by exposed copper, even though the resist image will be shifted one way or the other due to fabrication tolerances. Second, there must be a tolerance in the location in the various holes to accomodate any off-center hole and, for this purpose, the holes are made approximately 6–10 mils larger than the hole diameter. Third, the land must be further enlarged to protect the copper in the hole from being etched; the predetermined tolerance therefor being about 4–10 mils beyond the hole diameter. The sum of these tolerances and requirements provide a land area which is 20–30 mils larger than the hole. Since the smallest hole diameter typically is 13.5 mils in diameter, the smallest sized land area is 33.5–43.5 mils, or two and one-half to three times the size of the hole.

As a result of such large land areas, the conductor density is limited, and the spacing between plated through holes is limited to approximately 50 mil centers, a standard in the industry. If it were desired to increase the number of conductors, then more printed wiring board layers would be required to interconnect any given set of component terminations. It is preferable to reduce the number of layers and to increase the density within any given layer.

More recently, heremetic leadless carriers are increasingly being used, with the aim of terminations on 20 to 25 mil centers. Such decreased spacing creates a requirement for even higher density of printed wiring board layers than is achievable using conventional techniques.

SUMMARY OF THE INVENTION

The present invention avoids and overcomes these and other problems by formation of land areas which serve only to provide an electrical connection and which are at least as small as the conductors which they terminate. For example, feed-throughs or vias of 8 mils and less in cross-section are obtainable in printed circuit boards and, therefore, can at least equal the width of the conductors to which they are bonded.

Briefly, to produce such feed-throughs or vias, conductive via material is placed in openings through the dielectric core of the printed wiring board and is extended substantially to the opposed copper clad surface of the printed wiring board at the locations of the feed-through vias, thereby exposing the backside of the opposing copper foil. The exposed backside foil in the openings is coated with conductive resist material, and conductive cladding overlays both the dielectric core and the conductive resist material. While the conductive cladding and conductive via material may be of the same substance, the resist material must be of a composition which is different therefrom. Thus, portions of the conductive cladding may be removed, such as by an etchant, but the conductive resist material protects the conductive via material in the openings from being etched.

Several advantages result therefrom. Since protection of the plated hole during the etching is no longer a consideration, large pads are no longer required. Each via or feed-through has a dimension which is not necessarily larger than that of the conductor to which it is electrically coupled, e.g., 8 mils and smaller. Thus, no conductor channel is blocked by the feed-through and, therefore, the conductor density can be enormously increased. Also the center-to-center spacing between vias can be reduced from conventional 50 mil centers to 25 mil or even 12.5 mil centers. As a result, the number of printed wiring board layers required to interconnect any given set of component terminations is substantially reduced by allowing full utilization of the surface area of the layer. Further, more terminations per unit area are obtainable than allowed by conventional techniques. Because the number of layers is reduced for a given set of interconnections and terminations, the entire weight of the printed wiring board is reduced. For a given printed wiring board thickness or weight, it is further possible to obtain a higher electrical impedence if the number of layers is reduced by increasing the spacing between layers.

Other aims and advantages as well a more complete understanding of the present invention will appear from the following explanation of exemplary embodiments and the accompanying drawings thereof.

BRIEF DESCRIPTION OF THE DRAWINGS

FIGS. 1–12 depict several of the process steps used to form a printed wiring board layer from a sheet of dielectric material having a single conductive cladding, as shown in FIG. 1, or having a double cladding, as shown in FIG. 2a;

DETAILED DESCRIPTION OF THE INVENTION

Figure 9:
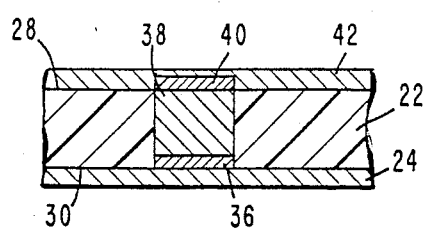

To produce a high conductor density layer for a multilayer printed wiring board, the beginning step may use a sheet or blank of dielectric material having a conductive cladding on one or both sides thereof. FIG. 1 illustrates a blank 20 having a core 22 of dielectric material with a single layer cladding 24 of conductive material thereon. Core 22 may comprise any conventional dielectric such as epoxy glass, polyimide glass, and epoxy-Kevlar or polyimide-Kevlar. Cladding 24 conventionally comprises one ounce copper, that is, approximately 1.4 mils thick. Using conventional methods of c etching or laser drilling, a hole or opening 26 of about 5 mil diameter is formed entirely through core 22 from its unclad surface 28 to its clad surface 30 to which cladding 24 is attached. It is to be understood that the diametrical opening size of 5 mils is given only for purposes of example and to illustrate that the feedthroughs or vias produced can be at least 2.5 times smaller than the smallest conventional via about 13.5 mils in diameter.

Alternatively, as depicted in FIG. 2a, a doubly clad blank 20a, comprising a dielectric core 22 and a double layer cladding 24 and 24a on both sides thereof, are processed to form an opening 26 therein. The opening is etched or otherwise formed through cladding 24a to provide perforations therethrough, after which a different etchant is used to etch through core 22, perforated cladding 24a acting as a resist therefor. If desired, laser drilling may be used to form hole 26 in core 22, with copper cladding 24a then consituting a reflective mask. Thereafter, cladding 24a is removed, again to form the structure depicted in FIG. 2. At this point, hole 26 has an approximate cross-sectional diameter of 5 mils. Cladding 24 is exposed by hole 26, and its upper layer is designated by indicium 32.

A resist 34 is then placed on the bottom side of cladding 24, as shown in FIG. 3, and exposed portion 32 of cladding 24 is fully coated, e.g., by electroplating, with a metallic resist 36, such as of gold, nickel, and tin-nickel, to a thickness of approximately 0.0001 to 0.0003 inches, as illustrated in FIG. 4. Dielectric 22 and resist 34 prevent plating on other portions of the blank.

As shown in FIG. 5, hole 26 is then completely filled with a conductive material 38 such as of copper to form a feed-through or via in core 22. Upper surface 28 of core 22 may be sanded to ensure that the copper filling is flush with the top of the hole (e.g., as seen in FIG. 6).

A further metallic resist 40, similar to conductive resist 36 is then electroplated or otherwise deposited on the top surface of copper via 38 at surface 28 of core 22, as viewed in FIG. 7. While both conductive resist materials 36 and 40 are extremely thin, that is from one ten-thousandths to three ten-thousandths of an inch, for purposes of illustration, these resists are drawn much thicker than they actually are.

As shown in FIG. 8, the next step involves the placement of a metallic foil 42, for example of copper, on surface 28 of core 22 and over conductive resist 40 by sequential electroless deposition and electroplating processes. Resist 34 is then stripped from cladding 24, to result in the structure of FIG. 9.

Figure 11:
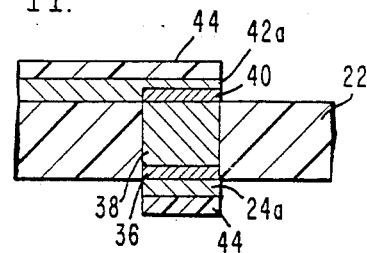
Figure 10:
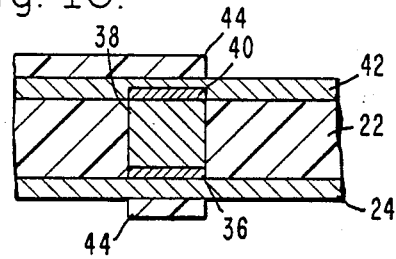

Both claddings 24 and 42 are then coated with a photoresist which is configured in a pattern 44 of the desired interconnections (see FIG. 10). Using an etchant which is capable of removing the material of claddings 24 and 42 but not that of metallic resists 36 and 40 and photoresist 44, dladdings 24 and 42 are selectively removed, the result being depicted in FIG. 11.

Photoresist 44, if perfectly placed over claddings 24 and 42 and conductive feed-through material 38, might be sufficient to prevent undesired etching of feed-throughs 38 in the absence of conductive resist material 36 and 40. However, in this case any misregistration would expose feed-throughs or vias 38 to undesired removal of material therefrom, which would prevent a proper electrical or mechanical connection thereto. Therefore, the plating of vias 38 by conductive resist 36 and 40 allows for any errors in registration.

Figure 12:
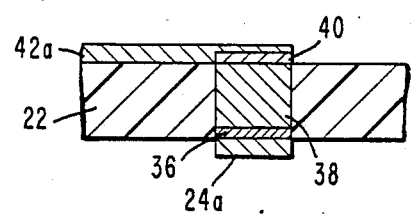

Resist material 44 is then removed to produce the finished printed wiring board layer shown in FIG. 12, in which the interconnections made from the claddings are denoted respectively by indicia 24a and 42a. For ease in preparing interconnections amongst the various feed-throughs or vias, interconnections 24a may be placed orthogonally with respect to interconnections 42a.

Figure 14:
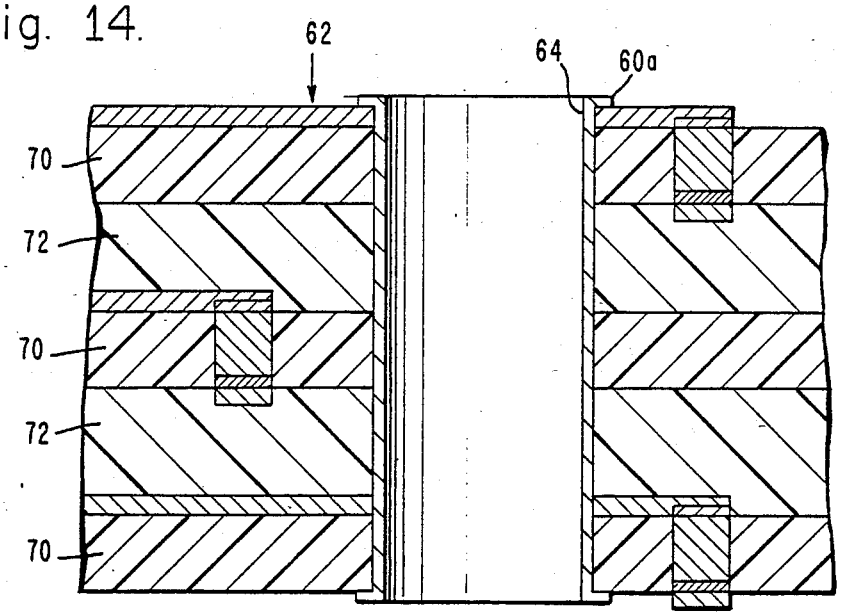
FIG. 14 is a cross-sectional view of a plurality of printed wiring board layers formed according to the teachings of the present invention joined with a conventional plated-through hole using, for example, the layer illustrated in FIG. 13.
Figure 13:
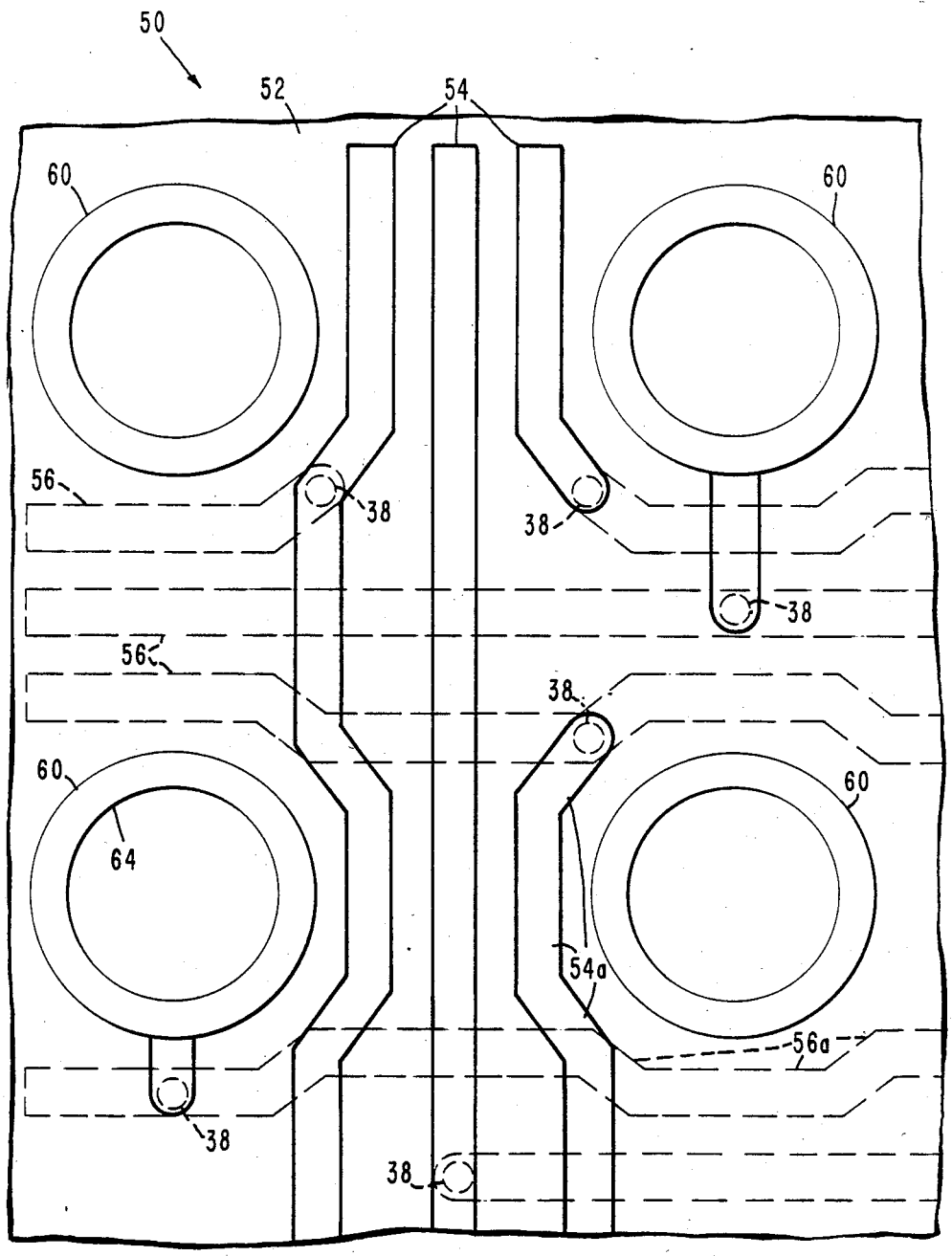
FIG. 13 depicts a layer having small vias, formed according to the present invention, and larger conventional land areas.

Furthermore, it may be desired to combine the feed-throughs and interconnection conductors formed according to the present invention with the standardized larger land areas of the prior art. Such a modification is illustrated in FIG. 13. A layer 50 comprises a dielectric core 52 having on one side a plurality of interconnection conductor lines 54, which extend generally in parallel, and on the other side another plurality of generally parallel interconnection lines 56 which extend orthogonally with respect to interconnections 54. Lines 54 and 56 are electrically interconnected by a plurality of feed-through vias 38 which are formed according to the teachings of the present invention. In addition, enlarged pads 60, e.g., of greater that 10 mil diameter, are also formed respectively by etching one or both of the claddings from which conductor lines 54 and 56 were produced. To provide space for enlarged land areas 60, conductor lines 54 and 56 are staggered from straight line configuration as shown, for example, by the portions 54a and 56a which thereby are routed around pads 60. Enlarged pads 60 may be used to form plated feed-through holes in a multilayer printed wiring board 62 as depicted in FIG. 14, which shows illustratively one feed-through hole 64 extending through a plurality of layers 70 joined together by a prepreg material 72 (a pre-impregnated cloth). Each layer 70 may have a configuration similar to that of layer 50 of FIG. 13. Feed-through hole 64 of FIG. 14 is enlarged by annularly configured pads 60a.

Although the invention has been described with reference to particular embodiments thereof, it should be realized that various changes and modifications may be made therein without departing from the spirit and scope of the invention.

What is claimed is:

1. A method capable of forming a printed wiring board layer having feed-through vias of 8 mil and smaller diameter on 12.5 mil centers and interconnections thereamongst, comprising the steps of:
    forming holes in a blank having a first conductive cladding on a first side thereof, the holes having diameters corresponding to those of the feed-through conductors, and locations corresponding to where the feed-through conductors are to be located;
    placing first resist material on the first cladding for protecting removal thereof;
    placing first conductive resist material within the holes and in contact with the cladding, the first conductive resist material comprising a material which is different from that of the first cladding;
    placing conductive material within the holes in contact with the first conductive resist material and extending substantially flush with the second side of the blank, the conductive material comprising material which is different from that of, and protected by, the first conductive resist material;
    placing second conductive resist material on the conductive material exposed at the second side of the blank for protection of the conductive material, the second conductive resist material comprising a material which is different from that of the conductive material and the first cladding;
    placing a second conductive cladding over the second conductive resist material and the second side of the blank, the second conductive cladding comprising a material which is different from that of the second conductive resist material;
    removing the first resist material from the first cladding;
    placing further resist material on the first and second claddings in a pattern of the interconnections;
    removing portions of the first and second claddings not protected by the further resist material without removing the first and second conductive resist materials to form the interconnections; and
    removing the further resist material.

2. A method according to claim 1 wherein said hole forming step comprises the steps of utilizing a sheet having a core of dielectric material with said first conductive cladding and a further conductive cladding on opposite sides thereof, forming perforations at the locations in the further conductive cladding on only one side of the core, extending the holes in the core to the first conductive cladding on the other side of the dielectric using the perforated conductive cladding as a mask, and removing the perforated cladding.

3. A method according to claim 2 wherein said extending step comprises the step of laser drilling in which the perforated cladding acts as a reflector of laser energy.

4. A method according to claim 2 wherein said extending step comprises the steps of using the perforated cladding as a resist mask, and etching portions of the core exposed by the perforated cladding.

5. A method according to claim 1 wherein said hole forming step comprises the steps of utilizing a sheet having a core of dielectric material with the first conductive material on the first side thereof, placing a resist material on the second side of the core having a pattern of the holes, etching the dielectric material exposed by the resist material, and removing the resist material.

6. A method according to claim 1 wherein said step of removing portions of the first and second claddings comprises the step of etching the portions by using a solution capable of etching the first and second cladding but not the first and second conductive resist material.

7. A method according to claim 6 wherein said first and second cladding and said conductive material comprise copper and said first and second conductive resist materials comprise gold, nickel or tin-nickel.

8. A method according to claim 1 further comprising the step of grinding the conductive material after having been placed in the holes to make the conductive material flush with the second side of the blank.

9. A method according to claim 1 further comprising the step of combining the as-processed blank, after said step of removing the further resist material, with other printed wiring layers to form a multilayer printed wiring board.

10. A method according to claim 1 wherein said step of removing portions of the first and second claddings includes the steps of forming enlarged conductive material of greater than 10 mil diameter among the feed-through vias in the blank from the first and second claddings, and routing the interconnections around the enlarged conductive material.

11. A method according to claim 10 further comprising the steps of combining the as-processed blank, having the feed-through conductors, enlarged conductive material and routed interconnections, with other printed wiring board layers to form a multilayer printed wiring board, and forming plated-through holes in the multilayer printed wiring board passing through and in electrical contact with the enlarged conductive material.

12. A method for forming feedthrough vias in and between the surfaces of a printed wiring board without the need for having enlarged via portions at the surfaces, comprising the steps of forming openings in a blank to define locations of the vias, placing conductive material only in the openings, covering exposed portions of the conductive material with conductive resist material which is of different composition therefrom, and utilizing the conductive resist material as a resist to protect the conductive material from removal by etchants applied during subsequent formation and coupling of conductors to the vias.

13. A method for forming a printed wiring board having feed-through vias and interconnections thereamongst, comprising the steps of:
    preparing a blank having conductive material placed in openings defining locations of the vias, conductive cladding covering the conductive material, and conductive resist material placed between the conductive material and the conductive cladding in which the resist material is differently composed from the conductive material and the conductive cladding; and removing portions of the conductive cladding to define the interconnections and, by using the conductive resist material as a resist, protecting removal of any of the conductive material in the openings.

14. A method according to claim 13 wherein said preparing step comprises the steps of:

forming the openings in the blank to the conductive cladding on the one side thereof;

depositing a first coating of the conductive resist material in the openings and on the conductive cladding exposed thereby;

depositing the conductive material in the openings and in contact with the first coating of the conductive resist material;

depositing a second coating of the conductive resist material on the conductive material exposed on the other side of the blank; and placing a second conductive cladding on the other blank side and in contact with the second conductive resist material coating.

15. A method according to claim 13 further comprising the step of forming the opening and the conductive material therein with dimensions not exceeding that of the interconnections.

16. A method for forming a printed wiring board having feed-through vias and interconnections thereamongst, comprising the steps of:

preparing a blank having conductive material placed in openings defining locations of the vias, conductive cladding covering the conductive material, and conductive resist material placed between the conductive material and the conductive cladding in which the resist material is differently composed from the conductive material and the conductive cladding; and removing portions of the conductive cladding by etching the conductive cladding with a solution capable of etching the cladding but not the conductive resist material to define the interconnections, the conductive resist material protecting removal of any of the conductive material.

* * * * *